(12) United States Patent
Hackl (10) Patent No.: US 12,399,208 B2
(45) Date of Patent: Aug. 26, 2025

(54) METHOD AND DEVICE FOR INSULATION MONITORING OF A WATER-ELECTROLYSIS INSTALLATION

(71) Applicant: Bender GmbH & Co. KG, Gruenberg (DE)

(72) Inventor: Dieter Hackl, Fernwald (DE)

(73) Assignee: Bender GmbH & Co. KG, Gruenberg (DE)

( * ) Notice: Subject to any disclaimer, the term of this patent is extended or adjusted under 35 U.S.C. 154(b) by 0 days.

(21) Appl. No.: 18/791,601

(22) Filed: Aug. 1, 2024

(65) Prior Publication Data

US 2025/0035696 A1   Jan. 30, 2025

(30) Foreign Application Priority Data

Jul. 27, 2023 (DE) ...................... 10 2023 119 910.2

(51) Int. Cl.
*G01R 31/12* (2020.01)
*G01R 31/40* (2020.01)

(52) U.S. Cl.
CPC ......... *G01R 31/1272* (2013.01); *G01R 31/40* (2013.01)

(58) Field of Classification Search
CPC .... G01R 31/1272; G01R 31/40; G01R 27/22; G01R 27/025; C25B 1/04
USPC ........................................ 324/551, 537, 500
See application file for complete search history.

(56) References Cited

U.S. PATENT DOCUMENTS

| | | | |
|---|---|---|---|
| 11,009,539 B2 * | 5/2021 | Geiss | G01R 31/52 |
| 2017/0328944 A1 * | 11/2017 | Broeckmann | G01R 31/52 |
| 2021/0396800 A1 * | 12/2021 | Nyström | G01R 35/00 |

FOREIGN PATENT DOCUMENTS

| | | |
|---|---|---|
| DE | 102020104956 B3 | 5/2021 |
| JP | 2009093822 A | 4/2009 |
| JP | 2010164531 A | 7/2010 |

\* cited by examiner

*Primary Examiner* — Giovanni Astacio-Oquendo
(74) *Attorney, Agent, or Firm* — Andrew D. Dorisio; Dickinson Wright PLLC (57) ABSTRACT

A method and an electrical circuit arrangement is for determining an insulation resistance of an ungrounded power supply system, which feeds electrical energy to the water-electrolysis installation. The fundamental idea of the method is based on predicting the insulation resistance of the ungrounded power supply system during an initial booting of the water-electrolysis installation and thus keeping the delay caused by the demineralization process as short as possible until the electrolysis process for subsequent booting processes of the electrolysis installation has been actually cleared. In a variation of the method, the electric conductance value and the temperature of the process water are additionally provided and recorded depending on the specific installation by the demineralization installation during the demineralization process. The result is a cost-efficient monitoring approach with a simple option for retrofitting for determining the insulation resistance of the ungrounded power supply system for the supply of water-electrolysis installations.

13 Claims, 5 Drawing Sheets

METHOD AND DEVICE FOR INSULATION MONITORING OF A WATER-ELECTROLYSIS INSTALLATION

This application claims priority to German Patent Application No. 10 2023 119 910.2 filed on Jul. 27, 2023, the disclosure of which is hereby incorporated by reference.

TECHNICAL FIELD

The invention relates to a method and an electrical circuit arrangement for determining an insulation resistance $R_{iso}$ of an ungrounded power supply system, which feeds electrical energy to a water-electrolysis installation.

BACKGROUND

In an ungrounded power supply system—which is also referred to as an isolated network or IT system (isolé terre)—no active conductor of the ungrounded power supply system can be conductively connected to ground according to standard requirements in DIN VDE 0100 part 100 in order to be able to forego an automatic shutdown of the power supply in the normatively required shutdown period in a first fault event. Precluded therefrom are sufficiently high-impedance connections of the active conductors to ground for measuring and functional reasons, as they are known from high resistance grounded systems (HRG), for example.

When an insulation fault, such as a ground fault or a short circuit to ground, occurs in an IT system, the function of the connected electrical consumers is not impaired, as a closed circuit cannot form between an active conductor of the IT network and ground owing to the ideally infinitely large insulation resistance.

SUMMARY

For the insulation resistance of the ungrounded power supply system (the resistance of the ungrounded power supply system to ground without the ohmic resistances introduced between the active conductors and ground in the IT system for measuring or functional reasons), insulation resistances of 100 Ohm/Volt nominal voltage are deemed uncritical according to standard DIN VDE 0100 part 530, for example. In this case, only 10 mA fault current flow to the protective conductor via the insulation path.

The insulation resistance of the ungrounded power supply system must therefore be continuously monitored using a standardized insulation monitoring device (IMD), a current insulation-resistance value being determined in the span of an IMD computing period as a function of the applied measuring method, such as for a pulsed, clocked measuring current. Another possible fault at another active conductor would cause a fault loop and the flowing fault current in conjunction with an overcurrent protection device would result in a shutdown of the installation including an operational standstill.

For resistance-grounded IT systems, insulation monitoring systems are available on the market which take into account computationally the value of the permanently installed, non-dynamic resistance between the neutral conductor of an IT transformer and ground when determining the insulation resistance for the IT system after the value has been manually input.

For non-linear or dynamically changing resistances functionally available, present parallel to the insulation resistance and between the active conductors and ground, this method is unsuitable.

In water electrolysis using PEM stack electrolyzers (proton exchange membrane electrolysis), but also in water electrolysis using alkaline electrolyzers, power is supplied predominately with the network form IT system.

The actual electrolysis process is not functionally cleared, i.e., a DC load current causing the electrolysis of water is not introduced, until an insulation resistance to be deemed uncritical for the installation by the insulation monitoring device is detected.

Insulation monitoring systems consequently have a negative effect on the economic efficiency of the installation due to the wait times described above until the electrolysis has been cleared. In order to compensate this production decrease, approaches typical in operational practice consist in

- bridging or disconnecting the monitoring system,
- changing the threshold value of the monitoring system such that a shutdown rarely occurs,
- only having the monitoring system go live after a time delay when the installation is in an uncritical, steady state operationally, or
- turning an ungrounded system to a grounded system in which larger currents are not identified via the process-water system until an accident or a fault has occurred.

Determining the insulation resistance of the IT system requires particular measures in particular for PEM water electrolysis, as an electrolytically conductive connection of the process water to the active conductors of the IT system exists for functional reasons. The electric resistance of this conductive connection of the process water depends, among other things, on the geometry of the water supply and on the conductivity of the process water.

This functional resistance of the process water is present parallel to the insulation resistance of the insulation path of the active conductor of the ungrounded power supply system to ground to be actually determined for the insulation resistance monitoring device for measuring reasons.

If the functional resistance of the process waters is of lower impedance than the required insulation resistance of the IT system, the insulation-resistance value consequently cannot be sufficiently detected from a measuring point of view according to the state of the art, as the value detected by the insulation monitoring device is mainly determined by the resistance of the process water and thus cannot give any insight on the actual state of the insulation path of the IT system.

As a too great mineralization of the process water is not optimal for the water electrolysis, the process water is demineralized before the DC load current has been cleared when booting the water-electrolysis installation has commenced. Until the demineralization of the process water has become fully effective, up to 30 min can pass.

With increasing effectiveness of the demineralization process of the process water, the electric conductivity of the process water decreases and the functional resistance of the process water to ground increases.

In the steady state of the demineralization, the conductivity of the process water is typically so low, that the value detected by the insulation monitoring device is mainly determined by the insulation resistance of the IT system and not by the functional resistance of the process water to ground.

According to the state of the art, an insulation monitoring device can only determine a total insulation resistance in the form of a parallel circuit from the insulation-resistance value of the IT system to actually be determined and from the functional resistance of the process water.

As explained above, the water electrolysis process is not cleared when booted until a sufficiently high functional resistance of the process water to ground has been achieved via the demineralization process of the process water.

In fluctuating water electrolysis applications with an often newly booted electrolysis installation, the delayed clearance leads to an economically relevant efficiency loss of the installation. There is the economically founded concern to be able to use the electrolysis installation as productively as possible as quickly as possible.

In patent DE 10 2020 104 956 B3, an approach for a comparable problem is described in which the parallel circuit from the insulation resistance to be determined and the functional resistance (resistances of the cooling-water/process-water system to ground) are avoided by the functional resistance being used as a coupling of the insulation monitoring system. This solution, however, is very specifically tailored to the installation to be monitored and difficult to install or retrofit in other existing electric installations.

Another problem is the monitoring of the direct current flow in the process-water pipe system during the electrolysis process. This direct current flows as a leakage current via an process-water supply pipe and an process-water drain pipe and is to be differentiated from the DC load current required for electrolysis and flowing via the electrodes.

In an individual electrolyzer in a sufficiently high-impedance IT system, the direct current in the process-water system itself will be negligently small for a relatively low-impedance functional resistance of the process-water system to ground when a mostly symmetrical installation design provides a symmetrical voltage of the active conductors to ground.

In contrast, a high direct current in the range of several amperes to over 100 A is to be anticipated in the process-water pipe system when     a one-sided low-impedance ground fault arises at an active conductor of the ungrounded power supply system or     several electrolyzers in an IT system are operated using their own unsynchronized active converters.

DC (leakage) currents, which leak via the process-water connections or via the cooling water, are monitored using residual-current monitoring devices according to the state of the art.

When the water electrolysis is applied, however, the DC residual-current monitoring in the process-water pipe system proves difficult and expensive from a measuring technology point of view, as the extremely large DC load currents of several 1000 A influence the residual current measuring of the DC (leakage) current in the process-water pipe system from a measuring technology point of view.

The object of the invention at hand is to determine the insulation resistance of the power supply system feeding the water-electrolysis installation as precisely as possible as soon as possible in the demineralization process—excluding the resistance of the process water to ground switched parallel and dynamically changing. As an additional security aspect, a DC flow in the process-water pipe system is to be considered in the insulation monitoring.

The fundamental idea of the method according to the invention is based on predicting the insulation resistance of the ungrounded power supply system—the insulation resistance of the insulation path of the ungrounded power supply system without the other functional, dynamically changing electric resistances of the process water—during an initial booting of the water-electrolysis installation and on consequently keeping the delay caused by the demineralization process as short as possible until the actual electrolysis process for the subsequent booting of the electrolysis installation has been cleared.

For this purpose, the water-electrolysis installation is first initially booted, starting with a demineralization process until a steady state of the demineralization of the process water has been achieved.

During the demineralization process, a number of total insulation-resistance values $R_{toti}$ are measured and stored at specific registration times $t_i$ by means of an insulation monitoring device, which feeds a measuring current $I_m$ driven by a measuring voltage $U_m$ to the ungrounded power supply system.

As a prerequisite, the ungrounded power supply system is monitored using an insulation monitoring device, which is implemented according to standard IEC 61557-8, is coupled between at least one of the active conductors of the ungrounded power supply system and ground and superposes a measuring voltage $U_m$ on the power supply system so a measuring current $I_m$ according to the insulation fault settles, the size of measuring current $I_m$ typically ranging from μA to mA.

The insulation monitoring device measures a total insulation-resistance value $R_{iso}$ at each registration time $t_i$ (index i reflects the temporal progression), the total insulation-resistance value $R_{toti}$ being derived from the parallel circuit of the insulation resistance $R_{iso}$ of the IT system and a functional process-water resistance value $R_{wi}$ of the process water prevailing at registration time $t_i$.

Respective process-water resistance values $R_{w1i}$, $R_{w2i}$ of the process-water supply pipe and the process-water drain pipe can be summarized in a mathematically simplified manner as functional process-water resistance value $R_{w1}$ of the process water owing to their parallel circuit of the process-water supply pipe and process-water drain pipe.

At the end of the (initial) demineralization process implemented during the initial booting, measuring-current portions $I_{w1}$, $I_{w2}$ are measured in the steady state of the demineralization in the process-water system by means of highly sensitive current sensors.

Measuring current $I_m$ flowing via the insulation monitoring device branches in a measuring-current portion $I_{iso}$, which flows via the insulation resistance $R_{iso}$ of the insulation path of the ungrounded power supply system, and in measuring-current portions $I_{w1}$, $I_{w2}$ flowing parallel thereto in the process-water supply pipe and the process-water drain pipe. By means of highly sensitive current sensors, measuring-current portions $I_{w1}$, $I_{w2}$ guided via the process-water pipe system are detected.

Furthermore, insulation resistance $R_{iso}$ is computed from measuring voltage $U_m$, registered measuring-current portions $I_{w1}$, $I_{w2}$ and measuring current $I_m$ and stored in the steady state of the demineralization.

Insulation resistance $R_{iso}$ is computed from known measuring voltage $U_m$, from measuring current $I_m$ registered in the insulation monitoring device and from measuring-current portions $I_{w1}$, $I_{w2}$ registered by the highly sensitive current sensors in the process-water pipe system.

For registration times $t_i$, process-water resistance values $R_{wi}$ are computed from total insulation-resistance values $R_{toti}$ and insulation resistance $R_{iso}$ based on the modeling of the parallel circuit formed by process-water resistance values $R_{wi}$ and insulation value $R_{iso}$.

After terminating the initial demineralization process, a regression curve $R_w(t)$ is computed for process-water resistance $R_w$.

In a method of the regression analysis, the time dependence $f(t)=R_w(t)$ of process-water resistance $R_w$ is described based on process-water resistance values $R_{wi}$. Thus, for example according to the criterion of the least squares, a linear regression curve $R_w(t)$ can be detected, from which regression value $R_w(T)$ of process-water resistance $R_w$ can be read for any determination time T. As for process-water resistance values $R_{wi}$, process-water resistance $R_w$ represents the parallel circuit of respective process-water resistance $R_{w1,2}$ of the process-water supply pipe and the process-water drain pipe.

For every reboot of the water-electrolysis installation, an expected insulation resistance $R'_{iso}(T)$ is repeatedly computed starting from regression value $R_w(T)$ for respective determination time T and from current total insulation-resistance value $R_{tot}(T)$ measured by means of the insulation monitoring device for a respective determination time T in subsequent regular booting processes for determination time T, which is temporally consecutive in the interval of the IMD determination period, during the demineralization process.

For other, regular, functionally intended booting processes during the demineralization process, expected insulation-resistance value $R'_{iso}(T)$ is consequently computed for a determination period T proceeding according to the duration of the IMD computation period. Expected insulation-resistance value $R'_{iso}(T)$ is estimated starting from regression value $R_w(T)$ gathered from regression curve $R_w(t)$ and from current total insulation-resistance value $R_{tot}(T)$ measured by the insulation monitoring device, circuitry correlation being derived from the modeling of the parallel circuit from expected insulation resistance $R'_{iso}$ and process-water resistance $R_w$.

The water-electrolysis installation is cleared as soon as expected insulation-resistance value $R'_{iso}(T)$ exceeds a predetermined threshold value $R_{lim}$ in the progressing of the continuous computation.

Since the conductivity of the process water is higher at the beginning of the demineralization process, total insulation-resistance values $R_{toti}$ measured by the insulation monitoring device are first determined by the parallel effective (low) process-water resistance $R_w$. As the demineralization progress processes, the electric conductivity of the process water decreases, whereby expected insulation-resistance value $R'_{iso}(T)$ estimated for a progressing determination time T becomes increased. As soon as expected insulation-resistance value $R'_{iso}(T)$ exceeds a predetermined threshold value $R_{lim}$ in the continuously progressing computation in the sequence of the demineralization process, power is supplied to the water-electrolysis installation.

In another advantageous embodiment, the number of registration times $t_i$ and their temporal intervals allow a sufficiently precise modeling via the regression curve.

The number of registration times $t_i$ and their temporal interval are chosen such during the demineralization process of the initial booting that a mathematical modeling yields a sufficiently precise and reliable estimation of expected insulation-resistance value $R'_{iso}(T)$ via a regression curve.

Advantageously, several temperature-adapted regression curves $R_w(t)$ are computed as a function of an process-water temperature.

For strong temperature fluctuations of the process water, regression curves $R_w(t)$ adapted to respectively prevailing process-water temperatures can serve as the foundation for determining regression value $R_w(T)$.

In contrast to the first alternative solution described above, this second alternative solution differs in that the electric conductivity and the temperature of the process water of the demineralization installation are additionally provided and registered pertaining to each specific installation during the demineralization process for the initial booting of the water-electrolysis installation.

Instead of the direct temporal dependence detected by means of the regression analysis, a time-independent function $R_w(R_{tot}, S, \vartheta)$ is established for process-water resistance $R_w$ using the variables total insulation-resistance value $R_{toti}$, electric conductivity $S_i$ and temperature value $\vartheta_i$, the function being used for a temporally consecutive determination time T for subsequent regular booting processes in order to compute an expected insulation resistance $R'_{iso}(T)$.

Preferably, the number of registration times $t_i$ and their temporal intervals allow describing process-water resistance $R_w$ as a function of the recorded values total insulation resistance $R_{toti}$, electric conductivity $S_i$ and temperature value $\vartheta_i$ via a time-independent function $R_w(R_{tot}, S, \vartheta)$.

Total insulation-resistance value $R_{toti}$, electric conductivity $S_i$ are measured and stored such using a "sampling rate" that a sufficient amount of determination equations are available for establishing an equation system from which functional dependency $R_w(R_{tot}, S, \vartheta)$ of process-water resistance $R_w$ can be derived.

Preferably, measuring-current portions $I_{w1}$, $I_{w2}$ are measured by the highly sensitive current sensors in the µA to mA range.

Due to the negative impact via the direct current from a measuring point of view and to the low current intensity of the supplied measuring current $I_m$, their measuring-current portions $I_{w1}$, $I_{w2}$ must be registered highly sensitively. Suitable for this purpose are current sensors directly disposed in the process-water pipe system and having a flux-gate current sensor technology in the µA to mA range.

In particular for a pulse-shaped, clocked measuring current $I_m$, the amplitude difference (peak-to-peak value) of the measuring-current portions $I_{w1}$, $I_{w2}$ is assessed in order to be as independent as possible from an absolute DC load in the process-water pipe system from a measuring point of view.

In addition to determining insulation resistance $R_{iso}$, direct current $I_{DC1}$, $I_{DC2}$ is monitored, which appears as a leakage current in the process-water supply line and the process-water drain pipe of the process-water pipe system.

On the one hand, this allows quickly verifying whether direct current $I_{DC1}$, $I_{DC2}$ exceeds a critical value. A risk of inadmissibly high current loads, can arise in a unilateral low-impedance ground fault at an active conductor of the DC power supply system and can lead to the deactivation of the affected electrolyzer, can thus be identified in due time.

On the other hand, the DC operating point of the sensitive measuring of measuring-current portions $I_{w1}$, $I_{w2}$ (preferably implemented using flux-gate sensor technology) can be monitored and thus a fault-free determination of insulation resistance $R_{iso}$ can be enabled.

Preferably, direct current $I_{DC1}$, $I_{DC2}$ is measured in the process-water pipe system by means of robust current sensors in the single-digit ampere range to a level of over 100 amperes.

The Direct current monitoring is to be configured for registering Direct currents in the single-digit ampere range to a level of over 100 A. Preferably, cost-effective and robust semiconductor sensors can be used in this instance.

Furthermore, the water-electrolysis installation is only cleared should direct current $I_{DC1}$, $I_{DC2}$ not exceed a predetermined value.

Together with monitoring direct current $I_{DC1}$, $I_{DC2}$ in the process-water supply pipe, the water-electrolysis installation is only cleared in the form of an AND gating when both monitoring parameters insulation resistance $R_{iso}$ and direct current $I_{DC1}$, $I_{DC2}$ are available within a range provided by pre-settable (threshold) values and are thus uncritical.

The electrical circuit arrangements are configured for implementing the methods for determining insulation resistance $R_{iso}$ of an ungrounded power supply system supplying the water-electrolysis installation as intended by the invention.

The claimed structural features of the electrical circuit arrangements according to the invention implement the method steps of the methods disclosed herein, respectively, as intended by the invention. Consequently, the technical effects attained with these methods and the advantages resulting therefrom equally pertain to the corresponding electrical circuit arrangements.

In summary, the invention at hand allows a cost-efficient monitoring approach with a simple option for retrofitting for determining insulation resistance $R_{iso}$ of an ungrounded power supply system for supplying water-electrolysis installations.

In particular, the methods according to the invention and the electrical circuit arrangements according to the invention and implementing these methods have the following properties in the functional interaction of their features:

A standard insulation monitoring of the efficiency of insulation paths is made possible without decreasing the normatively recommended threshold values.

Intricate and cost-intensive, sensitive residual-current measuring technology in the DC load circuit can be replaced with a sensitive DC measurement in the process-water pipe system which is easier to realize.

The non-sensitive DC measurement, which is to be added inexpensively, in the process-water pipe system allows monitoring the DC operating point of the sensitive current measurement for determining the insulation resistance $R_{iso}$ and enables quickly identifying inadmissibly high, dangerous direct currents in the process-water pipe system.

BRIEF DESCRIPTION OF THE DRAWINGS

Advantageous design features are derived from the following description and the drawings, which describe preferred embodiments of the invention using examples.

DETAILED DESCRIPTION

Figure 1:
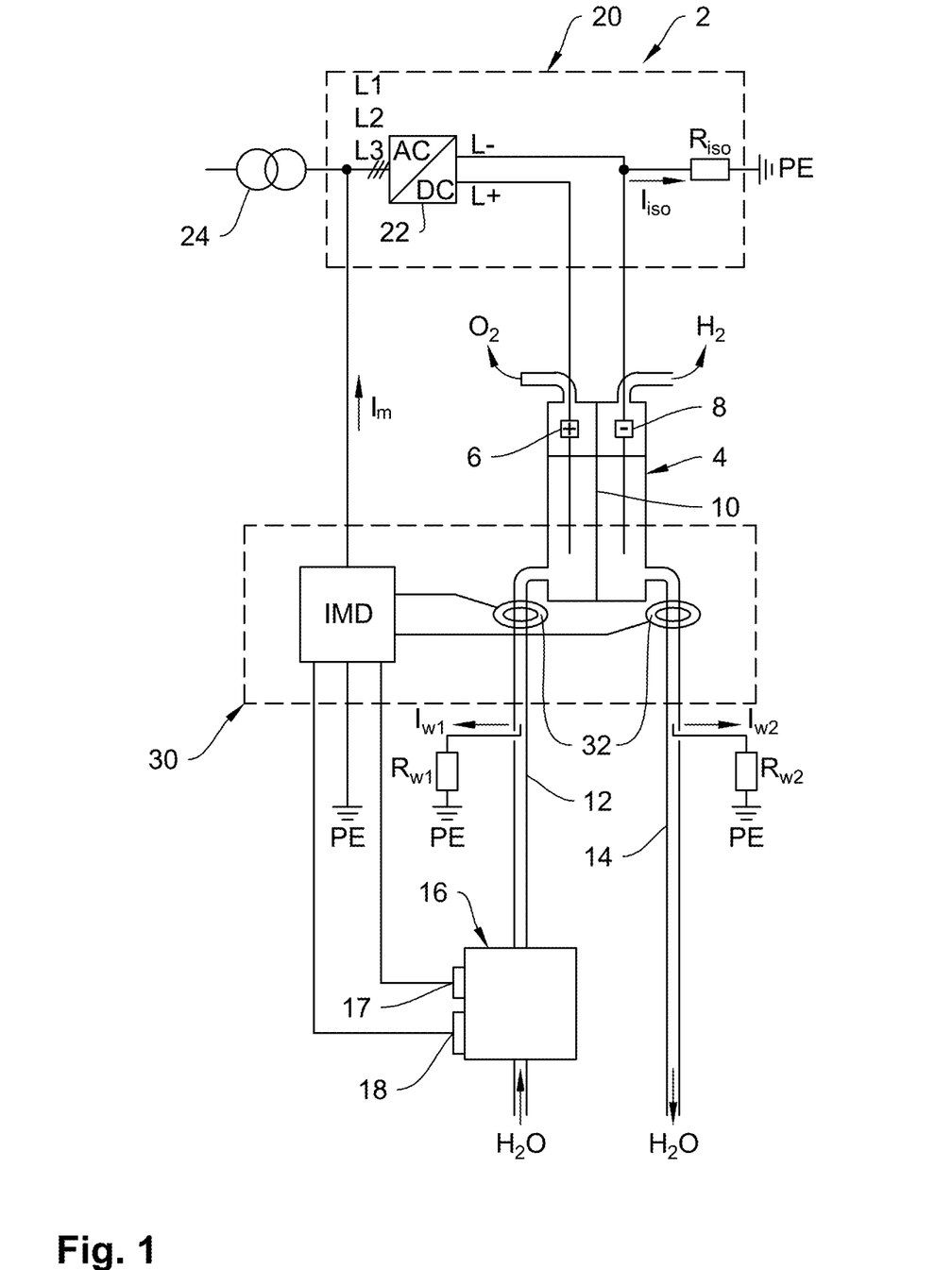
FIG. 1 shows schematically the design of a water-electrolysis installation with installation monitoring.

FIG. 1 shows schematically the design of a water-electrolysis installation 2 with insulation monitoring using the PEM electrolysis as an example.

Water-electrolysis installation 2 comprises a PEM electrolysis cell 4 having electrodes 6, 8 and a polymer membrane 10 and having an process-water supply line 12, an process-water drain pipe 14 and openings for the released $O_2$ and the produced hydrogen $H_2$.

To demineralize process water $H_2O$, water-electrolysis installation 2 has a demineralization device 16, which is disposed at the input of process-water supply line 12.

For the implementable measurement and the storage of electric conductance values $S_i$ of process water $H_2O$ and temperature values $\vartheta_i$ of process water $H_2O$, demineralization device 16 comprises a conductance-value measurement device 17 and a temperature measuring device 18.

Electrodes 6, 8 are supplied with electrical energy by an ungrounded power supply system 20. Ungrounded power supply system 20 comprises a rectifier 22, which is fed by a 3-phase power source 24 via active conductors L1, L2, L3. On the outlet side, rectifier 22 is connected to electrodes 6, 8 via active conductors L+, L−. Ungrounded power supply system 20 has an insulation resistance $R_{iso}$ to ground PE.

Generally, several PEM electrolysis cells 4 can be connected to ungrounded power supply system 20.

Water-electrolysis installation 2 including demineralization device 16 with conductance-value measuring device 17 and temperature measuring device 18 and ungrounded power supply system 20 form a presumed application environment for the invention at hand and are not components of the invention.

It is the task to monitor insulation resistance $R_{iso}$ of ungrounded power supply system 20 by means an electrical circuit arrangement 30 according to the invention.

Electrical circuit arrangement 30 comprises a standardized insulation monitoring device IMD according to product standard IEC 61557-8, and, for each process-water supply pipe 12 and process-water drain pipe 14 of each PEM electrolysis cell 4 connected to ungrounded power supply system 20, additionally one highly sensitive current sensor 32, which is suitable for determining measuring current portions $I_{w1}$, $I_{w2}$ flowing via process-water resistances $R_{w1}$, $R_{w2}$ with sufficient accuracy. In this example, highly sensitive current sensors 32 are connected to insulation monitoring device IMD, which performs all calculations under processor control.

Figure 2:
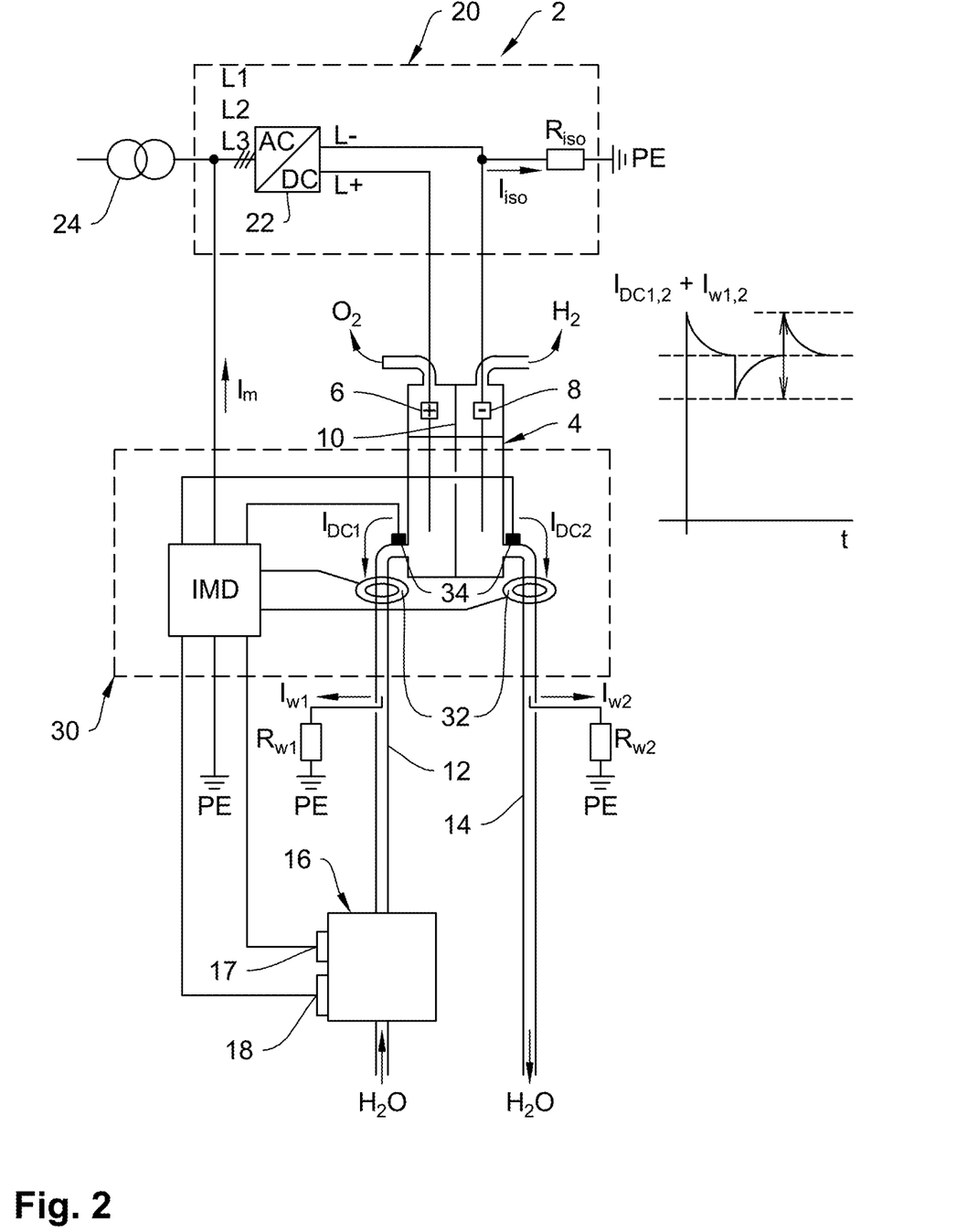
FIG. 2 shows the water-electrolysis installation from FIG. 1 with a supplementing DC monitoring.

In FIG. 2, water-electrolysis installation 2 of FIG. 1 is shown with supplemental DC monitoring.

For this purpose, a robust current sensor 34 for measuring respective direct current $I_{DC1}$, $I_{DC2}$ is additionally disposed in process-water supply pipe 12 and process-water drain pipe. Robust current sensors 34 are connected to insulation monitoring device IMD for assessing detected direct currents $I_{DC1}$, $I_{DC2}$ in each instance as well.

Respective measuring-current portions $I_{w1}$, $I_{w2}$ superpose a possible direct current $I_{DC1}$, $I_{DC2}$ which is relatively high in comparison to measuring-current portions $I_{w1}$, $I_{w2}$. Shown demonstrationally but not to scale is the assessment of the amplitude difference (peak-to-peak value) of measuring-current portions $I_{w1}$, $I_{w2}$ for a pulse-shaped, clocked measuring current $I_m$ in order to implement the measurement in the process-water pipe system independently of an absolute DC load.

Figure 3:
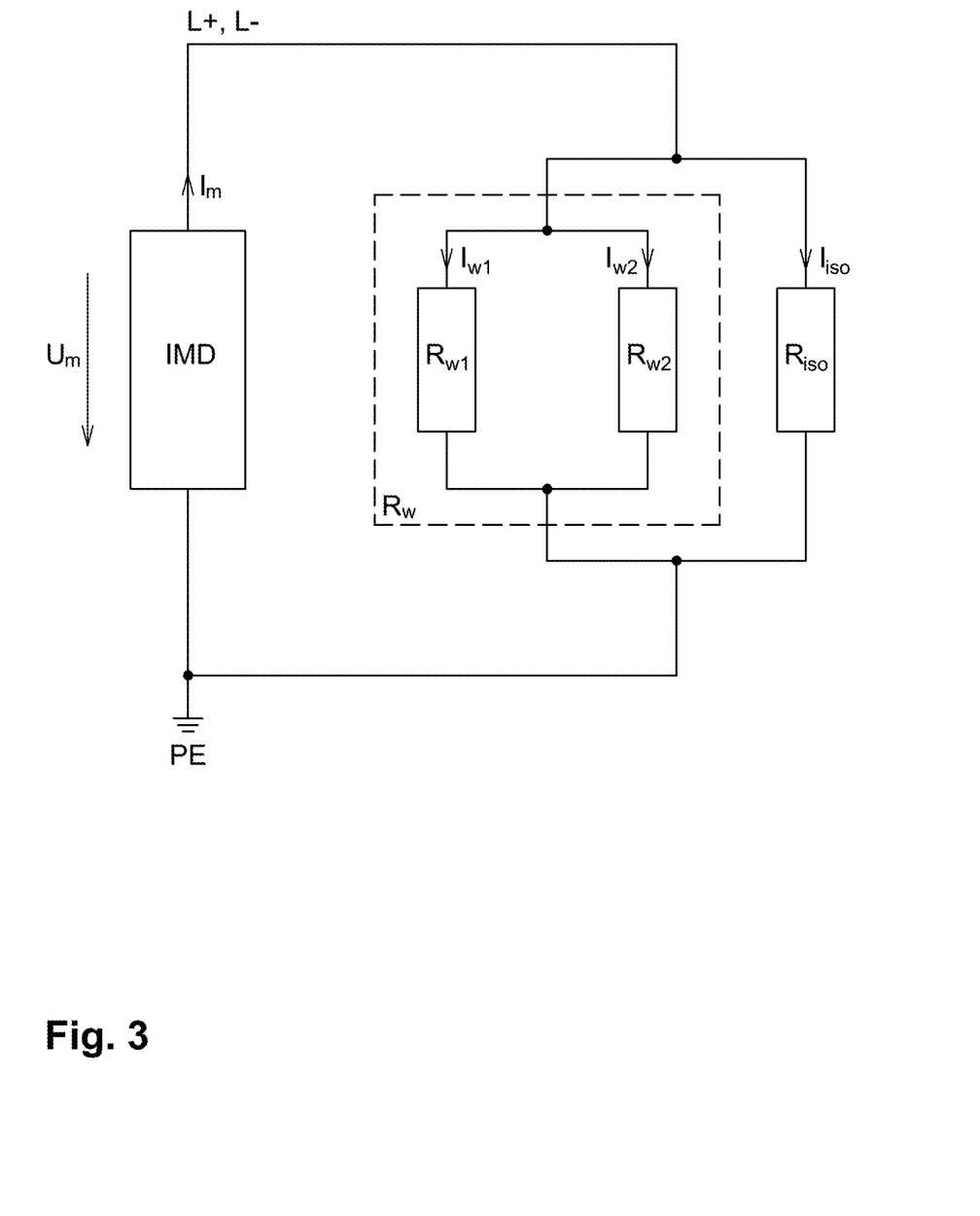
FIG. 3 shows an equivalent circuit diagram of the insulation monitoring of the water-electrolysis installation.

FIG. 3 shows an equivalent circuit diagram of the insulation monitoring of water-electrolysis installation 2 supplied by ungrounded power supply system 20. Based on the equivalent circuit diagram, corrected insulation resistance $R_{iso}$ is detected.

Process-water resistances $R_{w1}$, $R_{w2}$ together with insulation resistance $R_{iso}$ of ungrounded power supply system 20 form a parallel circuit. To determine insulation resistance $R_{iso}$, this parallel circuit is subjected to a measuring voltage $U_m$ by insulation monitoring device IMD, measuring voltage $U_m$ driving a measuring current $I_m$ which branches into measuring-current portions $I_{w1}$, $I_{w2}$ flowing vain process-water resistances $R_{w1}$, $R_{w2}$ and measuring-current portion $I_{iso}$ flowing via insulation resistance $R_{iso}$.

Since measuring voltage $U_m$ is known, measuring current $I_m$ is measured by insulation monitoring device IMD and measuring-current portions $I_{w1}$, $I_{w2}$ are registered by highly sensitive current sensors 32, measuring-current portion $I_{iso}$ flowing via insulation resistance $R_{iso}$ can be computed as follows (n=2 applies for the observed exemplary embodiment):

$$I_{iso} = I_m - \sum_{x=1}^{n} I_{wx}. \qquad \text{equation (1)}$$

Adjusted/cleaned and thus correct insulation resistance $R_{iso}$ is derived therefrom according to $$R_{iso} = \frac{U_m}{I_{iso}}, \qquad \text{equation (2)}$$

$$R_{iso} = \frac{U_m}{I_m - \sum_{x=1}^{n} I_{wx}}.$$

Figure 4:
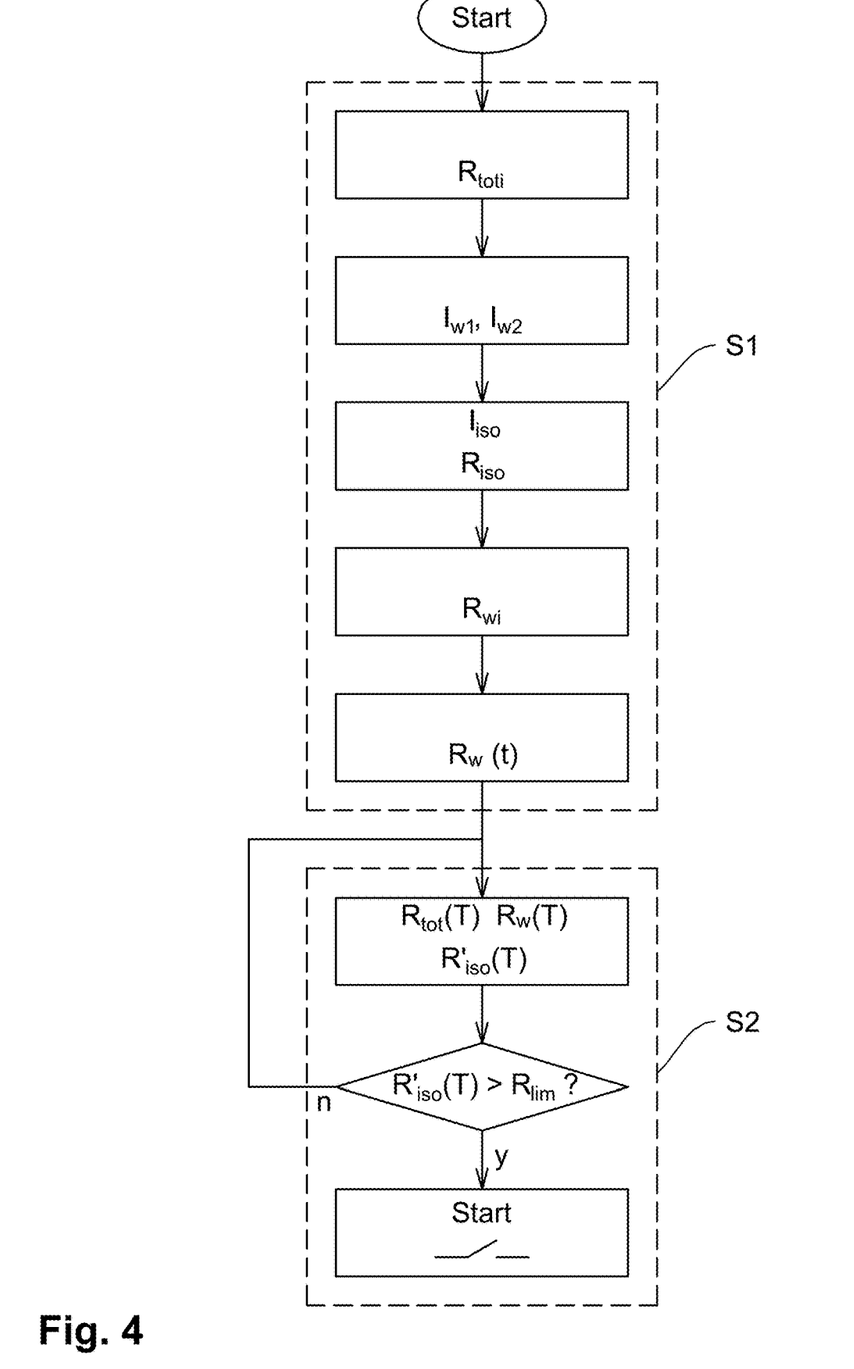
FIG. 4 shows a sequence diagram of a method according to the invention for insulation monitoring (first alternative solution).

FIG. 4 summarizes the method sequence of the first alternative solution according to one embodiment of the invention.

In this context, the variables to be processed are characterized with the index i in all instances to clarify that the measured or computed values are a temporal sequence. Thus, the process-water resistance $R_w$ computed for the registration time $t_i$ is referred to as process-water resistance value $R_{wi}$.

Within initial booting process S1, total insulation-resistance values $R_{toti}$ are initially measured during the demineralization process by means of insulation monitoring device IMD.

In the steady state of the demineralization, measuring-current portions $I_{w1}$, $I_{w2}$ are measured in process-water pipe system 12, 14 by means of highly sensitive current sensors 32. With the application of equation (1), measuring-current portion $I_{iso}$ flowing via insulation resistance $R_{iso}$ can be computed, thus yielding insulation resistance $R_{iso}$ with equation (2).

Since insulation resistance $R_{iso}$ is consequently known and total insulation-resistance value $R_{toti}$ is measured, the equation $$R_{wi} = \frac{R_{toti} * R_{iso}}{R_{iso} - R_{toti}}. \qquad \text{equation (3)}$$

is yielded based on the parallel circuit of process-water resistance $R_w$ with insulation resistance $R_{iso}$ for the result of process-water resistance values $R_{wi}$ effective during the demineralization process.

Based on thus detected process-water resistance values $R_{wi}$, a regression curve $R_w(t)$ is established for process-water resistance $R_w$.

Initial booting S1 is thus concluded and obtained regression curve $R_w(t)$ can be used for other, operationally intended booting processes S2.

This occurs in the manner that an expected insulation-resistance value $R'_{iso}(T)$ is computed in subsequent booting processes S2 during the demineralization process for a temporally consecutive determination time T.

The prediction value of expected insulation-resistance value $R'_{iso}(T)$ is computed while taking into consideration regression value $R_w(T)$ obtained for this determination time T from regression curve $R_w(t)$ and current total insulation-resistance value $R_{tot}(T)$ measured by means of insulation monitoring device IMD at respective determination time T:

$$R'_{iso}(T) = \frac{R_{tot}(T) * R_w(T)}{R_w(T) - R_{tot}(T)}. \qquad \text{equation (4)}$$

In this manner, a statement can be made regarding an expected insulation-resistance value $R'_{iso}(T)$ at soonest possible determination time T in subsequent demineralization processes. As soon as continuously computed insulation-resistance value $R'_{iso}(T)$ exceed a predetermined threshold value in the progression of the subsequent demineralization process, the water-electrolysis installation is cleared.

Figure 5:
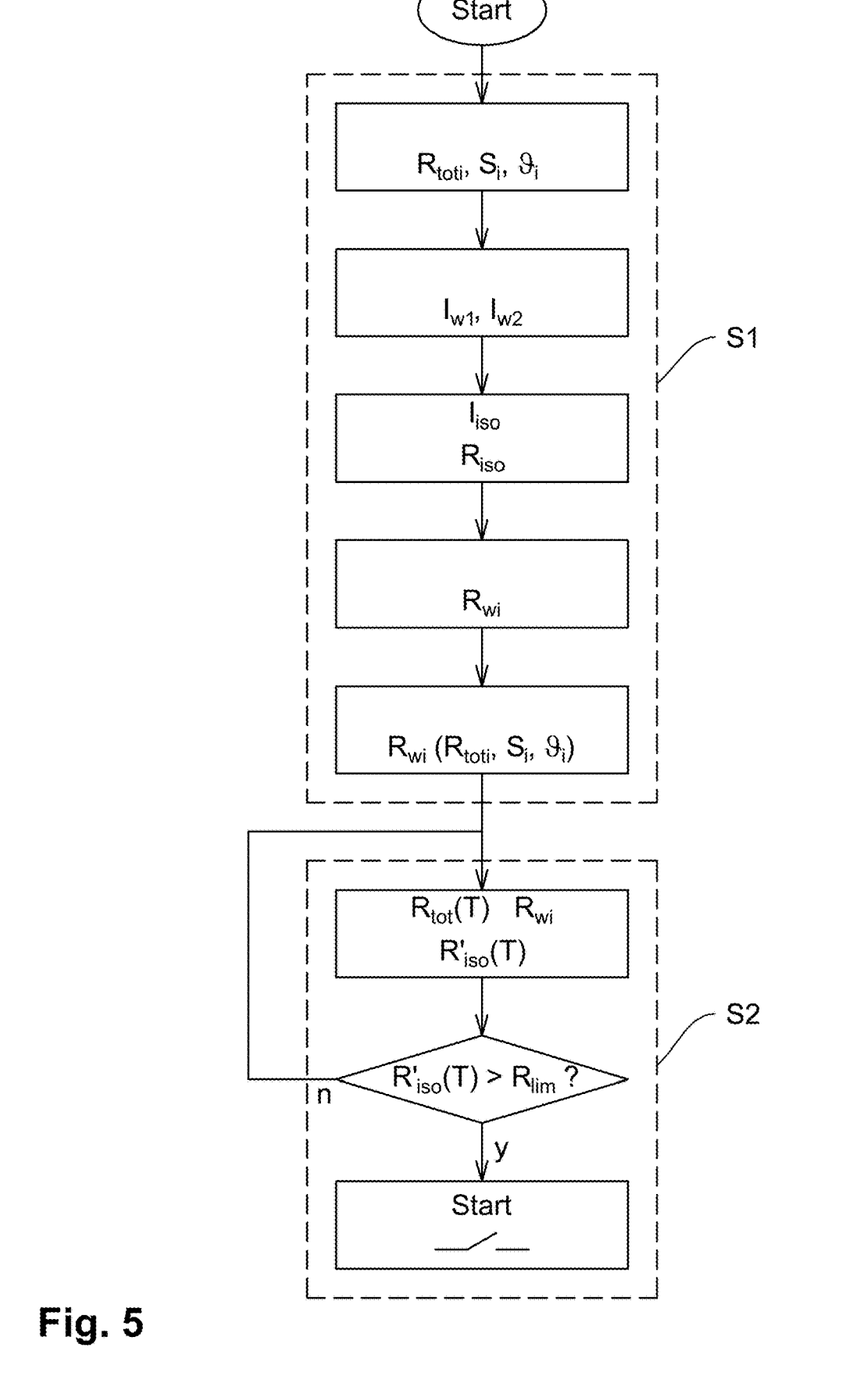
FIG. 5 shows a sequence diagram of another method according to the invention for insulation monitoring (second alternative solution).

FIG. 5 shows a sequence diagram of the method according to the invention for insulation monitoring according to the second alternative solution.

In contrast to the first alternative solution shown in FIG. 4, electrical conductivity value $S_i$ of the process water and temperature value $\vartheta_i$ of the process water are registered as independent functional parameters within initial booting process S1 during demineralization process at determined registered times $t_i$ in addition to measuring and storing total insulation-resistance value $R_{toti}$.

A time-independent function $R_w(R_{tot}, S, \vartheta)$ replaces regression analysis $R_w(t)$ from the first alternative solution for process-water resistance $R_w$, from which process-water resistance value $R_w(T)$ effective at respective determination time T can be determined for subsequent initial processes S2.

Expected insulation-resistance value $R'_{iso}(T)$ computed continuously analogously to equation (4) with process-water resistance $R_w(T)$ given by time-independent function $R_w(R_{tot}, S, \vartheta)$ is then tested for an exceedance of a predetermined threshold value $R_{lim}$.

The invention claimed is:

1. A method for determining an insulation resistance $R_{iso}$ of an ungrounded power supply system (20), which feeds electrical energy to a water-electrolysis installation (2), the method comprising the steps:

initially booting (S1) the water-electrolysis installation (2) starting with a demineralization process until a steady state of the demineralization of the process water has been achieved;

during the demineralization process, measuring and saving a number of total insulation-resistance values $R_{toti}$ at specific registration times $t_i$ by means of an insulation monitoring device (IMD), which feeds a measuring current $I_m$ driven by a measuring voltage $U_m$ to the ungrounded power supply system (20);

measuring measuring-current portions $I_{w1}$, $I_{w2}$ in an process-water pipe system (12, 14) by means of highly sensitive current sensors (32) in the steady state of the demineralization;

computing and storing insulation resistance $R_{iso}$ from measuring voltage $U_m$, registered measuring-current portions $I_{w1}$, $I_{w2}$ and measuring current $I_m$ in the steady state of the demineralization;

computing process-water resistance values $R_{wi}$ from total insulation-resistance values $R_{toti}$ and insulation resistance $R_{iso}$ for registration times $t_i$ based on a modeling of a parallel circuit formed by process-water resistance values $R_{wi}$ and insulation resistance $R_{iso}$;

computing a regression curve $R_w(t)$ for process-water resistance $R_w$, an expected insulation-resistance value $R'_{iso}(T)$ being computed in subsequent regular booting processes (S2) for a temporally consecutive determination time T during the demineralization process, starting from a regression value $R_w(t)$ at respective determination time T and from a current total insulation-resistance value $R_{tot}(T)$ measured by means of the insulation monitoring device (IMD) at respective determination time T; and the water-electrolysis installation (2) being cleared as soon as expected insulation-resistance value $R'_{iso}(T)$ has exceeded a predetermined threshold value $R_{lim}$ in the progression of the continuous computation.

2. The method according to claim 1, wherein the number of registration times $t_i$ and their temporal interval allow a sufficiently precise modeling via the regression curve $R_w(t)$.

3. The method according to claim 1, wherein several temperature-adapted regression curves $R_w(t)$ are computed as a function of an process-water temperature $\vartheta$.

4. The methods according to claim 1, wherein measuring-current portions $I_{w1}$, $I_{w2}$ are measured by highly sensitive current sensors in the μA to mA range.

5. The methods according to claim 1, wherein a direct current $I_{DC1}$, $I_{DC2}$ is measured in the process-water pipe system (12, 14).

6. The method according to claim 5, wherein direct current $I_{DC1}$, $I_{DC2}$ is measured in the process-water pipe system (12, 14) in the single-digit ampere range to a magnitude of over 100 Amperes by means of robust current sensors.

7. The methods according to claim 1, wherein the water-electrolysis installation (2) is only cleared should direct current $I_{DC1}$, $I_{DC2}$ not exceed a predetermined value.

8. An electrical circuit arrangement (30) for determining an insulation resistance $R_{iso}$ of an ungrounded power supply system (20), which feeds electrical energy to a water-electrolysis installation (2), the electrical circuit arrangement (30) having an insulation monitoring device (IMD) according to product standard IEC 61557-8 which serves for measuring and storing a number of total insulation-resistance values $R_{toti}$ and is adapted to execute the method of claim 1, and having a highly sensitive current sensor (32) disposed in both an process-water supply pipe (12) and an process-water drain pipe (14).

9. The electrical circuit arrangements according to claim 8, wherein the highly sensitive current sensors for measuring measuring-current portions $I_{w1}$, $I_{w2}$ are designed as current sensor technology for measurements in the range of μA to mA.

10. The electrical circuit arrangements according to claim 8, wherein a robust current sensor technology serves for measuring a direct current $I_{DC}$ in the process-water pipe system (12, 14) and is designed for measurements in the single-digit ampere range to a magnitude of over 100 Amperes.

11. A method for determining an insulation resistance $R_{iso}$ of an ungrounded power supply system (20), which feeds electrical energy to a water-electrolysis installation (2), the method comprising the following steps:

initially booting (S1) the water-electrolysis installation (2) starting with a demineralization process until a steady state of the demineralization of the process water has been achieved;

during the demineralization process, measuring and storing a number of total insulation resistances $R_{toti}$ at specific registration times $t_i$ by means of an insulation monitoring device (IMD), which feeds a measuring current $I_m$ driven by a measuring voltage $U_m$ to the ungrounded power supply system (20), as well as measuring and storing electric conductance values $S_i$ of the process water and of temperature values $\vartheta_i$ of the process water;

measuring measuring-current portions $I_{w1}$, $I_{w2}$ in an process-water pipe system (12, 14) by means of highly sensitive current sensors (32) in the steady state of the demineralization;

computing and storing insulation resistance $R_{iso}$ from measuring voltage $U_m$, registered measuring-current portions $I_{w1}$, $I_{w2}$ and measuring current $I_m$ in the steady state of the demineralization;

computing process-water resistance values $R_{wi}$ from total insulation-resistance values $R_{toti}$ and insulation resistance $R_{iso}$ for registration times $t_i$ based on a modeling of a parallel circuit formed by process-water resistance values $R_{wi}$ and insulation resistance $R_{iso}$;

computing a time-independent function $R_w(R_{tot}, S, \vartheta)$ for process-water resistance $R_w$, an expected insulation resistance $R'_{iso}(T)$ being computed in subsequent regular booting processes for a temporally consecutive determination time T during the demineralization phase, starting from process-water resistance $R_w(T)$ given by time-independent function $R_w(R_{tot}, S, \vartheta)$ at respective determination time T and from a current total insulation-resistance value $R_{tot}(T)$ measured by means of the insulation monitoring device (IMD) at the respective determination time T; and the water-electrolysis installation (2) being cleared as soon as expected insulation-resistance $R'_{iso}(T)$ has exceeded a predetermined threshold value $R_{lim}$ in the progression of the continuous computation.

12. The method according to claim 11, wherein the number of registration times $t_i$ and their temporal interval allow a description of process-water resistance $R_w$ as a function of the recorded values total insulation-resistance value $R_{toti}$, electric conductance value $S_i$ and temperature value $\vartheta_i$ via a time-independent function $R_w(R_{tot}, S, \vartheta)$.

13. An electrical circuit arrangement (30) for determining an insulation resistance $R_{iso}$ of an ungrounded power supply system (20), which feeds electrical energy to a water-electrolysis installation, the electrical circuit arrangement (30) having an insulation monitoring device (IMD) according to product standard IEC 61557-8 which serves for measuring and storing a number of total insulation-resistance values $R_{toti}$ and is adapted to execute the method of claim 11, and having a highly sensitive current sensor (32) disposed in both an process-water supply pipe (12) and an process-water drain pipe (14).

* * * * *